Figure 1:
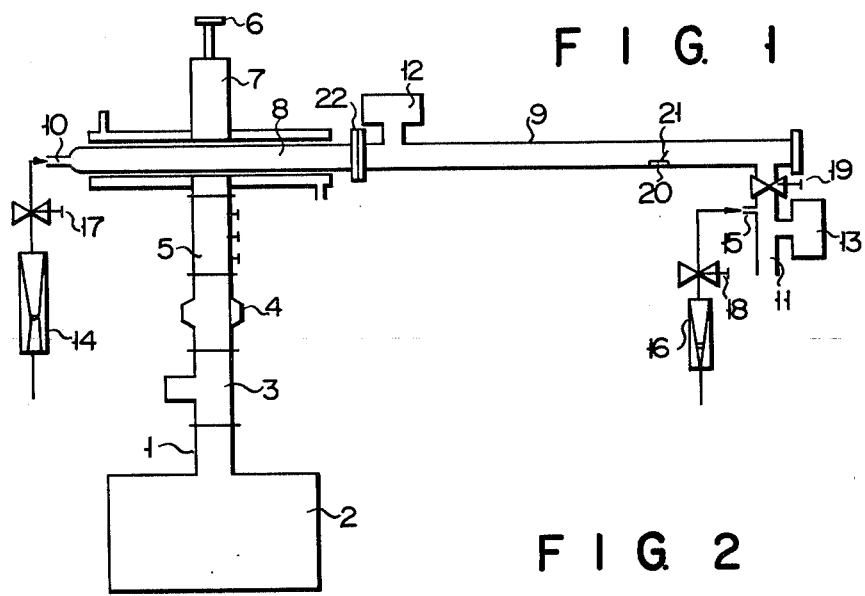

United States Patent [19]
Shibagaki et al.

[11] 4,160,690
[45] Jul. 10, 1979

[54] GAS ETCHING METHOD AND APPARATUS

[75] Inventors: Masahiro Shibagaki, Hiratsuka; Yasuhiro Horiike, Tokyo; Takashi Yamazaki, Yokohama, all of Japan

[73] Assignee: Tokyo Shibaura Electric Co., Ltd., Japan

[21] Appl. No.: 892,330

[22] Filed: Mar. 31, 1978

[30] Foreign Application Priority Data

Mar. 31, 1977 [JP] Japan .................................. 52-35448

[51] Int. Cl.² .................. C23F 1/02; C23C 15/00; B01K 1/00
[52] U.S. Cl. ............................ 156/643; 204/192 E; 204/298; 204/164; 250/531
[58] Field of Search ............ 204/192 E, 192 EC, 298, 204/164; 250/531; 156/643; 219/121 P

[56] References Cited
U.S. PATENT DOCUMENTS

| | | | |
|---|---|---|---|
| 4,065,369 | 12/1977 | Ogawa et al. | 204/164 |
| 4,123,663 | 10/1978 | Horiike | 250/531 |

*Primary Examiner*—Aaron Weisstuch

*Attorney, Agent, or Firm*—Finnegan, Henderson, Farabow & Garret

[57] ABSTRACT

A gas etching apparatus comprising an etching gas-producing chamber; means for introducing into said chamber a mixture of a gas containing fluorine atoms and a gas containing oxygen atoms; means for activating the gas mixture received in the etching gas-producing chamber; an etching chamber provided in a region located apart from the etching gas-producing chamber and free from the electric field produced by the activating means; and an etching gas-conducting pipe means for establishing communication between the etching gas-producing chamber and etching chamber, the improvement being that the etching gas-conducting pipe means is designed to satisfy the following formula:

$$10^{-1} Se \leq C_T \leq 5 \times 10^2 Se$$

where:
$C_T$ = conductance (l/min) of the etching gas-conducting pipe means;
$Se$ = effective exhaust speed (l/min) in the etching chamber.

12 Claims, 13 Drawing Figures

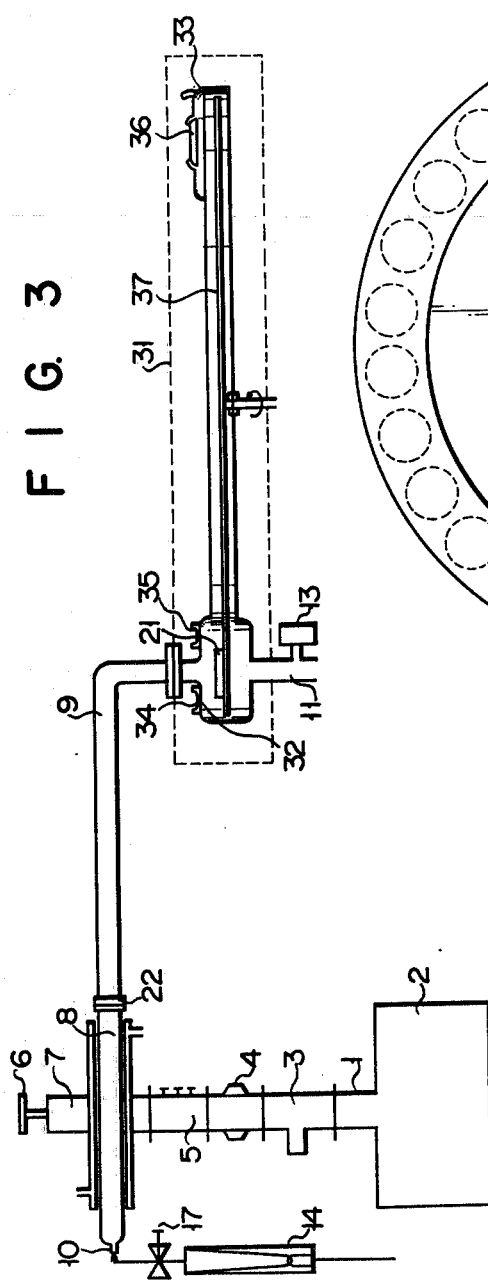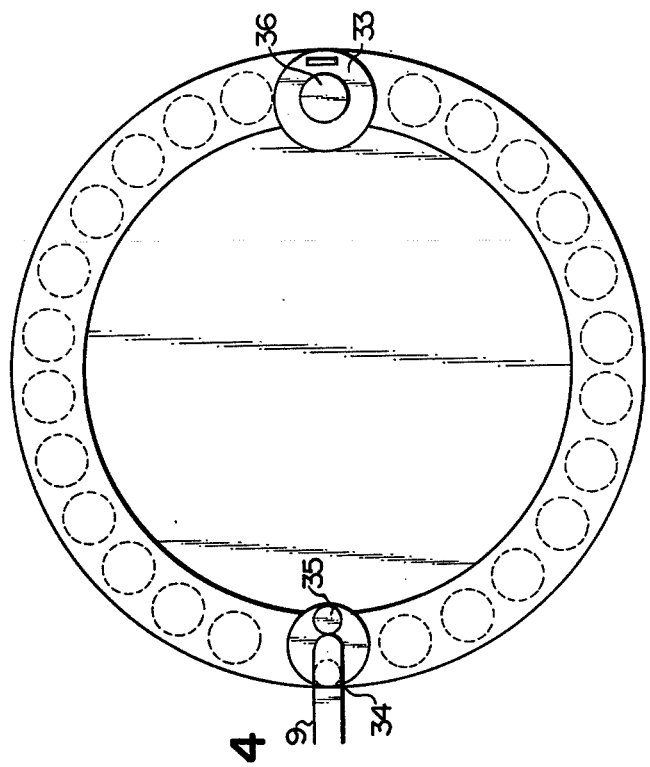

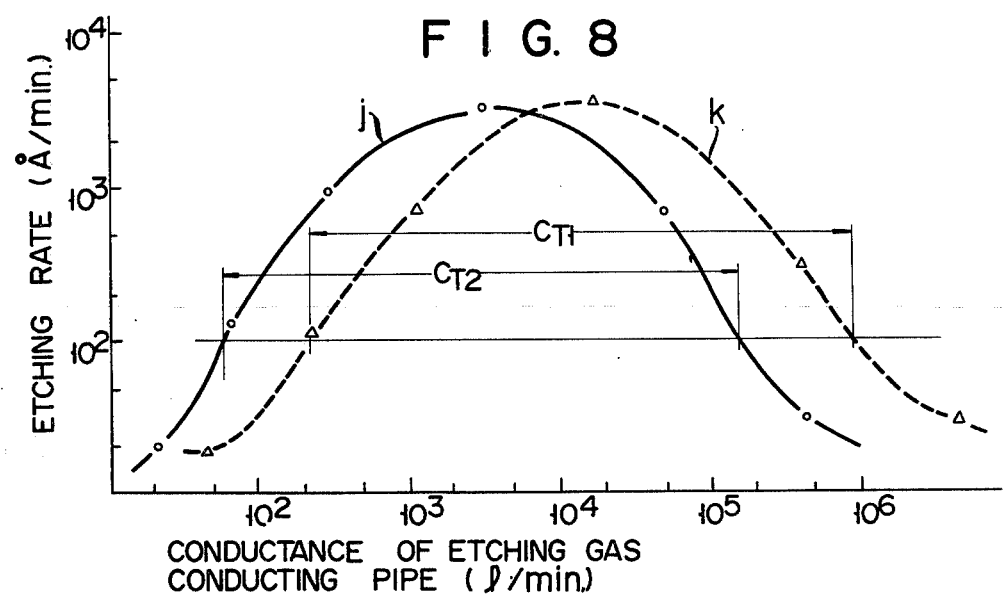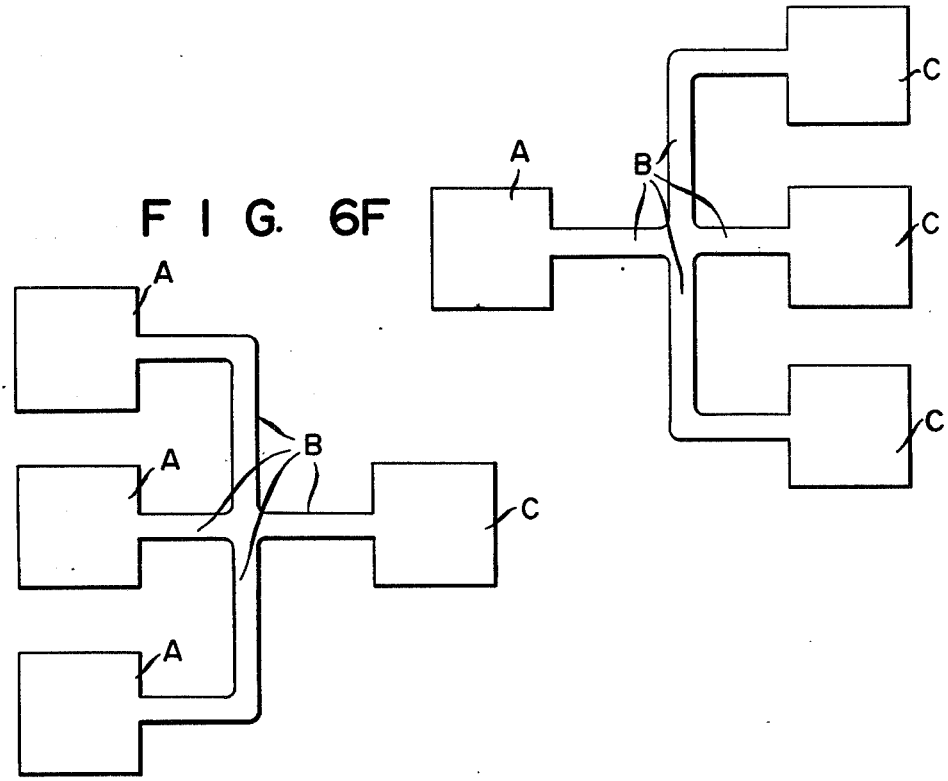

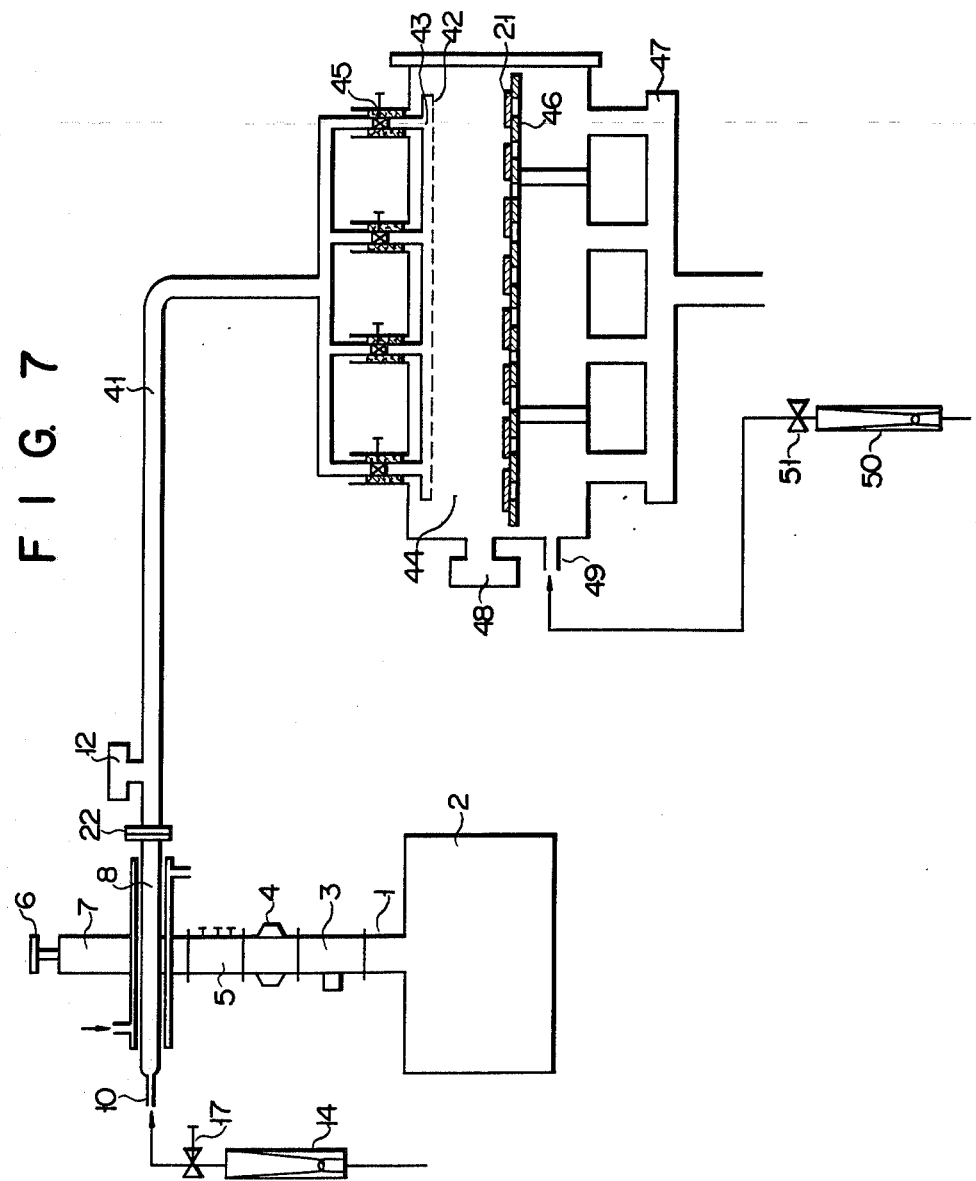

GAS ETCHING METHOD AND APPARATUS

This invention relates to a gas etching apparatus. Recently, a plasma etching process has come to be widely applied instead of a wet etching process in the minute working of a thin film formed of, for example, polycrystalline silicon or silicon nitride when an integrated circuit is manufactured. This plasma etching process has the advantage that a photoresist can be used as a mask for a material being etched, thus simplifying the etching process and increasing the reliability of a semiconductor device thus produced. Also, environmental pollution does not arise, because it is unnecessary to use, for example, hydrofluoric acid as in the case of the wet etching process.

A gas plasma etching apparatus proposed to date includes the type set forth in the U.S. Pat. No. 3,616,461. This proposed gas plasma etching apparatus comprises a reaction chamber for holding a material being etched and radio frequency (hereinafter abbreviated as "RF") generating means located outside of the reaction chamber. The gas etching process of the U.S. Pat. No. 3,616,461 comprises the steps of introducing a fluorine-containing gas such as Freon into a reaction chamber built of, for example, quartz; supplying RF power to an RF coil surrounding the reaction chamber to effect discharge, thereby producing a gas plasma; and etching a material in this gas plasma. This gas etching process has the following drawbacks:

(1) The temperature of a material being etching is increased by heat radiated from the gas plasma. As a result, the photoresist tends to deteriorate, and sometimes itself becomes etched.

(2) The electric properties of a semiconductor device are degraded by bombardment by RF-accelerated charged particles included in the gas plasma.

(3) Radiation, including ultraviolet rays are produced by excitation in the reaction chamber while discharge is carried on therein, presenting difficulties in noticing the end point of etching.

A gas etching apparatus developed to eliminate the above-mentioned drawbacks includes the type disclosed in the U.S. Pat. No. 3,879,597. This gas etching apparatus comprises a quartz cylinder containing a perforated aluminium cylinder referred to as "an etching tunnel" and surrounded by RF-generating means. Etching is carried out in the perforated aluminium cylinder. With the latter gas etching apparatus, a gas plasma is generated outside of the etching tunnel. Only fluorine radicals contained in the gas plasma are conducted into the etching tunnel through the small holes of the aluminium perforated cylinder. Therefore, this gas etching apparatus has been regarded to reduce the drawbacks described under the foregoing items (1), (2) and (3). With this gas etching apparatus, however, a gas plasma produced outside of the aluminium etching tunnel at high temperature and high concentration tends to fluorinate the aluminum component of the etching tunnel. The aluminum fluoride thus formed is in spite of its extremely low vapor pressure readily vaporized due to bombardment by the gas plasma and the temperature rise and undesirably settles on the material being etched. This vaporization and settlement raise new problems such as the occurrence of leak current in a transistor or diode produced.

One of the present inventors previously developed a gas etching apparatus which was quite different from the types proposed before and was free from the drawbacks attendant thereon. With the conventional gas etching apparatus, the production of etching gas and the actual etching took place in the same chamber. With the gas etching apparatus developed by one of the present inventors, however, the generation of etching gas and the actual etching were designed to be carried out in separate chambers. This gas etching apparatus comprises an etching gas-producing chamber and an etching chamber connected by an etching gas-conducting pipe. In this gas etching apparaus, etching occurs in a region (etching chamber) located away from a gas plasma region and free from an electric field produced by the activating means. The etching gas used was formed of a mixture of a gas containing fluorine atoms and a gas containing oxygen atoms. One of the present inventors further discovered that application of high frequency waves such as RF waves or microwaves enabled an etching gas to have a long effective life. The gas etching process developed by one of the present inventors was based on this discovery. Where an etching gas was formed only of a fluorine atom-containing gas like Freon as in the prior art, the etching gas could not have a long effective life, making it impossible to locate an etching gas-producing chamber apart from an etching chamber.

With the gas etching apparatus developed by one of the present inventors, however, an etching gas was formed of a mixture of a fluorine atom-containing gas and an oxygen-atom containing gas; an etching gas-producing chamber and an etching chamber were set apart from each other; and both chambers were connected by an etching gas-conducting pipe. Therefore, this developed apparatus had the following advantages:

(1) In the etching chamber, heat was not radiated from the gas plasma, enabling etching to be carried out at normal temperature, thereby protecting the photoresist from deterioration.

(2) A semiconductor device produced by the developed gas etching process did not have degraded electric properties.

(3) Where polycrystalline silicon, for example, was etched, fluorescent rays were generated. Moreover, the etching chamber was located sufficiently apart from a source of exciting light beams, including ultraviolet rays. Therefore, the end point of etching could be easily observed.

However, the above-mentioned gas etching apparatus previously developed by one of the present inventors did not clearly define the function of the etching gas-conducting pipe. Therefore, the need arose for a definite description of the various factors associated with the function of the etching gas-conductive pipe.

It is accordingly the object of this invention to provide a gas etching apparatus which comprises improved etching gas-conducting pipe means by which an etching gas activated in an etching gas-producing chamber can be efficiently introduced into an etching chamber.

According to an aspect of this invention, there is provided a gas etching apparatus comprising an etching gas-producing chamber; means for introducing a mixture of a gas containing fluorine atoms and a gas containing oxygen atoms into the etching gas-producing chamber; means for activating the gas mixture received in the etching gas-producing chamber; an etching chamber provided in a region located apart from the etching gas-producing chamber and free from the electric field produced by the activating means; and etching gas-conducting means for establishing communication between the etching gas-producing chamber and etching chamber, the improvement being that the etching gas-conducting means is designed to satisfy the following formula:

$$10^{-1} Se \leq C_T \leq 5 \times 10^2 Se$$

where:
$C_T$ = conductance (l/min) of the etching gas-conducting pipe means;
Se = effective exhaust speed (l/min) in the etching chamber.

Figure 2:
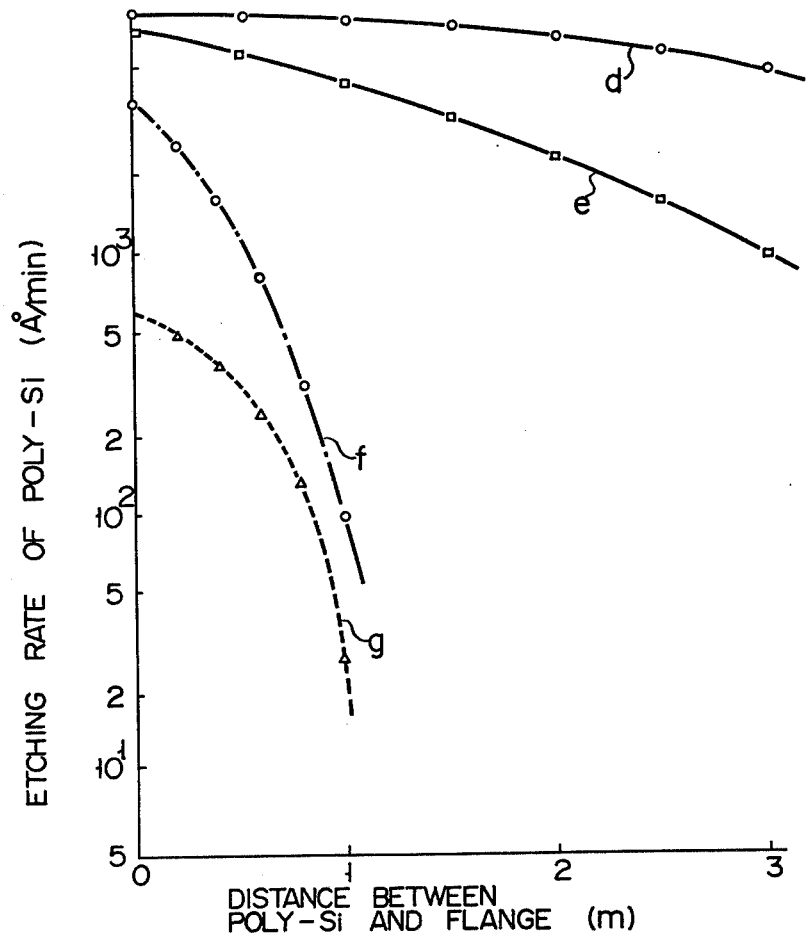
Figure 5:
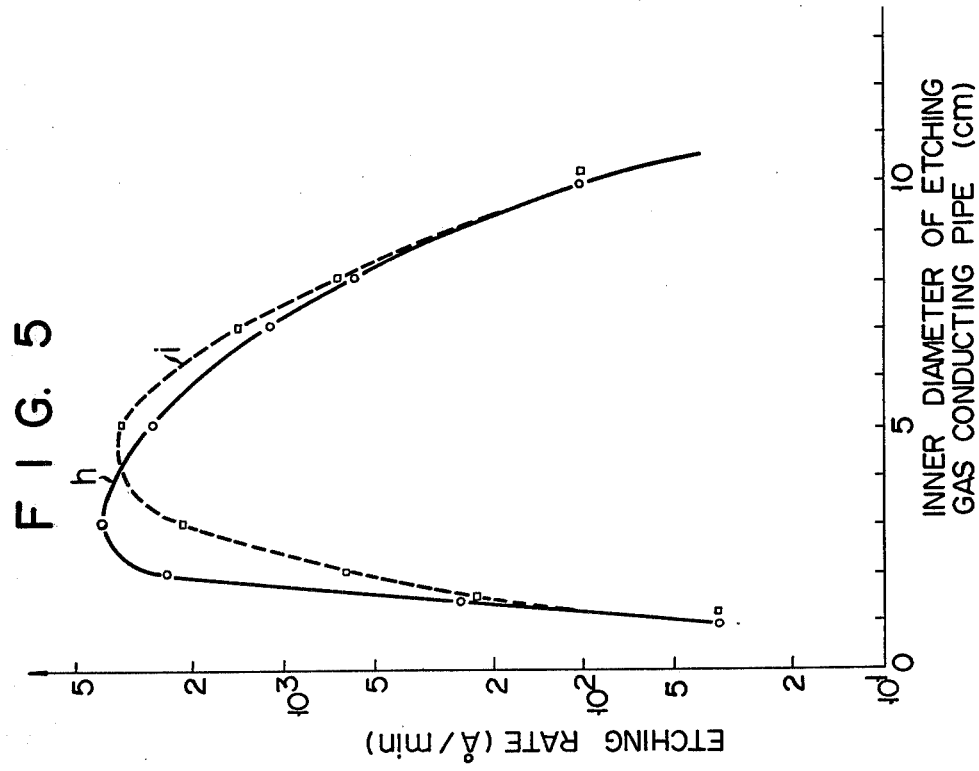

This invention can be more fully understood from the following detailed description when taken in conjunction with the accompanying drawings, in which:

FIGS. 1, 3 and 7 schematically show the arrangements of gas etching apparatuses according to the various embodiments of this invention;

FIGS. 2 and 5 graphically indicate the relationship between the inner diameter of the etching gas-conducting pipe of this invention and the etching rate;

FIG. 4 is a plan view of the etching chamber of a gas etching apparatus according to the embodiment of FIG. 3;

FIGS. 6A to 6F set forth the various forms of an etching gas-conducting pipe means embodying this invention; and FIG. 8 graphically indicates the relationship of the conductance of an etching gas-conducting pipe embodying this invention and the etching rate.

The present inventors have studied selection of optimum etching gas-conducting pipe means for a gas etching apparatus embodying this invention, wherein an etching gas-producing chamber and etching chamber are set apart from each other, and both chambers are connected by etching gas-conducting pipe means. As a result, the inventors have paid attention to the conductance of said etching gas-conducting pipe means and discovered that a conductance defined within a certain range promotes the efficient transfer of an etching gas into an etching chamber. The present invention is based on this discovery. The present inventors have further found that the above-mentioned conductance should fall within a range defined by the following formula:

$$10^{-1} Se \leq C_T \leq 5 \times 10^2 Se$$

where:
$C_T$ = conductance (l/min) of ethcing gas-conducting pipe means;
Se = effective exhaust speed (l/min) in an etching chamber.

This invention will be more fully understood by reference to the examples which follow.

EXAMPLE 1

This experiment was undertaken to measure the variations in etching rates of, for example, a silicon wafer as they relate to changes in the diameter and length of an etching gas-conducting pipe. An etching gas was formed of a mixture of carbon tetrafluoride gas (manufactured by the Du-Pont Company under the trademark "Freon") and an oxygen gas. The gas mixture was activated by microwave discharge means having a frequency of 2.45 GHz. FIG. 1 schematically shows the gas etching apparatus used in this experiment.

Referring to FIG. 1, microwave discharge means 1 comprises a microwave source 2, isolator 3 provided with a dummy load; power monitor 4, three-stub tuner 5 and applicator 7 equipped with a short plunger 6. Microwaves are sent forth from the microwave source 2 to the applicator 7 by control of the three-stub tuner 5 and short plunger 6 in such a manner that the issue of microwave reflections from the microwave source 2 can be reduced as much as possible.

A hollow cylindrical etching gas-producing chamber 8 penetrates the applicator 7 crosswise. This etching gas-producing chamber 8 is connected to a stainless steel etching gas-conducting pipe 9 whose inner wall is coated with a layer of polytetrafluoroethylene. The etching gas-producing chamber 8 is surrounded with cooling means for preventing a temperature rise in said etching gas-producing chamber 8. The etching gas-producing chamber 8 has a gas inlet 10, and the etching gas-conducting pipe 9 has a gas outlet pipe 11. A mixture of carbon tetrafluoride gas and oxygen gas brought into the etching gas-producing chamber 8 through the gas inlet 10 is excited by the energy of microwaves to form a gas plasma. The formation of the gas plasma leads to the generation of a highly activated material, that is, an etching gas or etchant. This etching gas is introduced into the etching chamber from the etching gas-producing chamber 8 through the etching gas-conducting pipe 9 and is drawn off through the outlet pipe 11. A diaphragm type vaccum indicator 12 is fitted near the inlet of the etching gas conducting pipe 9, and a similar diaphragm type vacuum indicator 13 is attached to the etching gas outlet pipe 11. A mass flow meter 14 is provided to measure the flow rate of the etching gas entering the etching gas-producing chambr 8. The etching gas outlet pipe 11 is provided with a gas inlet port 15 to measure effective exhaust speed. A mass flow meter 16 is provided to measure the flow rate of the gas introduced into the gas inlet port 15. A valve 17 is disposed downstream of the mass flow meter 14, and a valve 18 is positioned similarly downstream of the mass flow meter 16. An intermediate valve 19 is provided between the etching gas-conducting pipe 9 and etching gas outlet pipe 11. A material or wafer 21 mounted on a support 20 fixed in the etching gas-conducting pipe 9 was etched by operating a gas etching apparatus constructed as described above. The etching rate of the wafer 21 was determined. This wafer 21 was polycrystalline silicon prepared by thermally depositing monosilane (SiH4) on a silicon wafer. In this experiment, four different etching gas-conducting pipes 9 were used. The pipes had the same length of 3 meters, but had different inner diameters of 1cm, 3cm, 5cm and 10cm. A boundary between the etching gas-producing chamber 8 and etching gas-conducting pipe 9 could not be definitely defined, because the exciting beam region of the gas plasma varied with the microwave power generated, the gas pressure produced and the composition of the etching gas used. Therefore, the etching gas-conducting pipe 9 was assumed to have a length extending from the center of the etching gas-producing chamber 8 to the inlet of the etching chamber (or to the entrance of the etching gas outlet pipe 11, if a separate etching chamber was not provided, and etching was carried out in the etching gas-conducting pipe 9 itself). The distance between the material 21 and flange 22 was measured. The effective exhaust speed Se was set at 500 l/min. This value of the effective exhaust speed was calculated from the equation Se=Qe/Pe (where Qe denotes the flow rate of a prescribed amount of N2 gas when introduced through the gas inlet port 15 with the valve 19 closed; and Pe is the pressure occurring in the gas outlet pipe 11).

FIG. 2 shows the results of experiments conducted under the above-mentioned conditions. The ordinate of FIG. 2 represents the etching rate (Å/min) of polycyrstalline silicon, and the abscissa denotes the location of the polycrystalline silicon, that is, the distance between the silicon and the flange 22. The curves d, e, f, g of FIG. 2 indicate the etching rates of the polycrystalline silicon relative to said distance when hollow cylindrical etching gas-conducting pipes were used having different inner diameters of 3cm, 5cm, 10cm and 1cm, respectively. Microwave power applied was 680W as measured by the power monitor 4. Carbon tetrafluoride and oxygen used as the components of the etching gas had partial pressures of 0.4 Torr and 0.1 Torr respectively, as determined by the diaphragm type pressure gauge.

As seen from the graph of FIG. 2, when an etching gas-conducting pipe having an inner diameter of 3cm (curve d) was used, the etching rate did not noticeably fall even when the distance of the polycrystalline silicon was 3 meters, proving that said etching gas-conducting pipe could very efficiently introduce the etching gas. An etching gas-conducting pipe having an inner diameter of 5cm (curve e) displayed a satisfactory conducting rate for practical purposes, though slightly smaller than that of the conducting pipe of 3cm inner diameter. In contrast, etching gas-conducting pipes of 10cm and 1cm in inner diameter showed an extremely low gas-conducting rate. For instance, when the polycrystalline silicon was set more than 1 meter apart from the flange 22, little etching took place with respect to the etching gas-conducting pipe of 10cm inner diameter. Also, with the etching gas-conducting pipe of 1cm inner diameter, the etching rate was found to be low even if the wafer 21 was placed proximate to the etching gas producing chamber 8.

EXAMPLE 2

As in Example 1, experiments were made to measure the ethcing rate of polycyrstalline silicon, using etching gas-conducting pipe having different inner diameters. FIG. 3 shows the gas etching apparatus used in Example 2.

The gas etching apparatus of FIG. 3 comprised the same type of microwave discharge means 1 as that shown in FIG. 1 and utilized in Example 1. In the embodiment of FIG. 1, the etching gas outlet pipe 11 was connected to the etching gas-conducting pipe 9. As shown in FIG. 3, an etching chamber 31 was provided between the etching gas-conducting pipe 9 and etching gas outlet pipe 11. The etching gas-producing chamber 8 was made of quartz. The etching gas-conducting pipe 9 and etching chamber 31 were made of stainless steel and lined with a polytetrafluoroethylene layer. The etching gas-conducting pipe 9 had a length of 130cm (as measured from the center of the etching gas-producing chamber 8 to the entrance of the etching chamber 31).

FIG. 4 is a plan view of the disk-shaped etching chamber 31. Reaction chamber 32 comprises sight glasses 34, 35, and a wafer feed chamber 33 is also provided with a sight glass 36. The reaction chamber 32 is made as small as possible to prevent any unnecessary decline in the concentration of the etching gas. A supporting plate 37 carrying the wafer 21 is rotatably received in the etching chamber 31. This supporting plate 37 is made of stainless steel and has its surface coated with a polytetrafluoroethylene layer. The rotation of the supporting plate 37 enables a large number of wafers to be etched.

Measurement was made of the etching rate of the polycrystalline silicon in the second experiment in the same manner as in Example 1. In this experiment, the inner diameter of the etching gas-conducting pipe 9 was varied within the range of 1 to 10cm. Two different compositions (h) and (i) of etching gas were used separately. In composition (h), carbon tetrafluoride gas had a partial pressure of 0.4 Torr, and oxygen gas had a partial pressure of 0.2 Torr. In composition (i), carbon tetrafluoride gas had a partial pressure of 0.3 Torr, and oxygen gas had a partial pressure of 0.2 Torr. The partial gas pressure was determined by the diaphragm type pressure gauge 13 fitted to the etching gas outlet pipe 1. The microwave power applied was 600W, as measured by the power monitor 4.

FIG. 5 sets forth the results of the foregoing experiments. Curve h denotes the etching rate when the carbon tetrafluoride gas had a partial pressure of 0.4 Torr and the oxygen gas had a partial pressure of 0.1 Torr. Curve i represents the etching rate when the carbon tetrafluoride gas had a partial pressure of 0.3 Torr, and the oxygen gas had a partial pressure of 0.2 Torr. As seen from FIG. 5, a high etching rate was attained when the etching gas conducting pipe had an inner diameter falling within the range of from about 1.5cm to about 9cm, regardless of the above-mentioned partial gas pressure.

The above described Experiments 1 and 2 indicate that with the effective exhaust speed fixed, the gas etching rate or the efficiency of conducting etching gas primarily depends on the inner diameter of the etching gas-conducting pipe. Namely, where the etching gas-conducting pipe has an inner diameter falling within a certain range, then a high etching rate results. Conversely, where the inner diameter falls outside of the certain range, the etching rate sharply drops. This experimentally observed relationship is assumed to occur for the following reasons. First, for a high etching rate, a large amount of etching gas has to be supplied. To this end, the etching gas-conducting pipe should have a larger inner diameter, on assuming that the effective exhaust speed is fixed. Second and conversely, the flow velocity of an etching gas in the etching gas-conducting pipe decreases as the inner diameter of the etching gas-conducting pipe increases. Since the etching gas has a certain limited effective life, the activated etching gas decreases in concentration due to slow transit to the etching chamber through a conducting pipe having too large an inner diameter. Assuming a fixed effective exhaust speed, an etching gas-conducting pipe with a larger inner diameter offers a greater advantage for transport of a large amount of etching gas. However, a narrower etching gas-conducting pipe more effectively prevents the decrease in concentration of the activated etching gas. With all the above-mentioned factors taken into consideration, it will be seen that the inner diameter of an etching gas-conducting pipe should fall within a certain range to ensure a high etching rate. In view of this fact the present inventors have paid particular attention to the conductance of the etching gas-conducting pipe and have discovered that the optimum efficiency of supplying an etching gas to an etching chamber can be primarily defined as a function of the conductance of the etching gas-conducting pipe and the effective exhaust speed in the etching chamber.

Figure 6A:
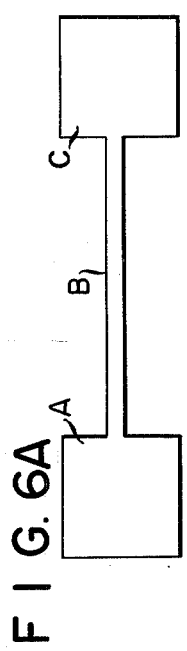
Figure 6B:
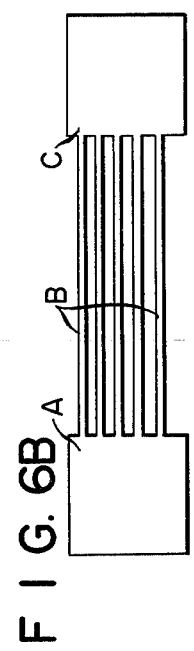
Figure 6C:
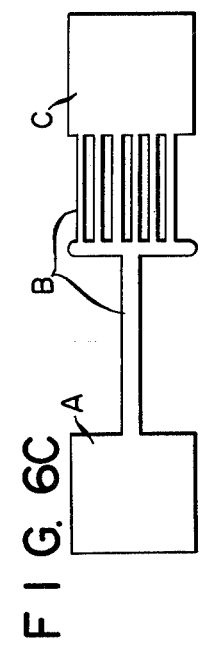
Figure 6D:
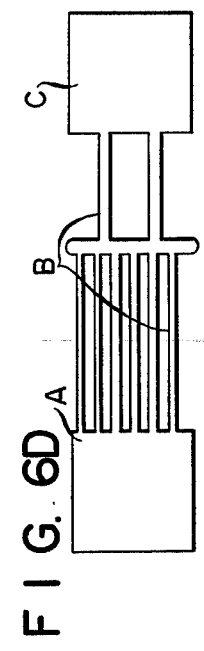

The etching gas-conducting pipe may not only be formed of a single round pipe, as shown in FIGS. 3 and 6A, but also many other types of pipes such as those indicated in FIGS. 6B to 6F are useful. Throughout FIGS. 6A to 6F, the character A denotes an etching gas-producing chamber; the character B an etching gas-conducting pipe; and the character C an ethcing chamber. The etching gas-conducting pipes illustrated in FIGS. 6B, 6C and 6D are designed to ensure the uniform etching of a material or wafer being etched. Where, as shown in FIGS. 6E and 6F, there are provided a plurality of etching gas-producing chambers or etching chambers, the etching gas-conducting pipe should be formed of a plurality of branch pipes.

EXAMPLE 3

Measurement was made of the etching rate of polycrystalline silicon relative to the conductance of the etching gas-conducting pipe and the effective exhaust speed in the etching chamber, using a gas etching apparatus provided with a branched type etching gas-conducting pipe. FIG. 7 shows the gas etching apparatus utilized in this experiment. Referring to FIG. 7, the microwave discharge means 1 and etching gas-producing chamber 8 are of the same type as those of Examples 1 and 2. Etching gas-conducting pipe 41 is divided into four branches in the downstream section. The lower ends of the respective branches are jointly connected to a common distribution pipe 43 bored with a large number of small ports 42. This distribution pipe 43 is provided to effect the uniform introduction of etching gas into the etching chamber 44. The respective branch pipes are each fitted with a valve 45 for control of the flow rate of etching gas. A stainless steel supporting plate 46 coated with a polytetrafluoroethylene layer is located in the etching chamber 44. A plurality of polycrystalline silicon wafers 21 are placed on the supporting plate 46. A common manifold gas outlet pipe 47 is provided for the uniform discharge of etching gas from the etching chamber 44. This etching chamber 44 is further provided with a diaphragm type pressure gauge 48, gas inlet pipe 49, mass flow meter 50 and valve 51. The gauge 48 and flow meter 50 are required to determine the effective exhaust speed.

Now, the conductance $C_T$ of the etching gas-conducting pipe may be defined by the following equation:

$$C_T = \frac{Q_A Se}{P_T(Se - Q_A/P_T)}$$

where:
$Se$ = effective exhaust speed (l/min) in the etching chamber 44;
$P_T$ = gas pressure (Torr) at the inlet to the etching gas-conducting pipe 41;
$Q_A$ = mass flow rate (Torr.l/min) of etching gas introduced into the gas etching apparatus;
$Se$ may be determinable from the previously described equation $Se = Qe/Pe$.

Polycrystalline silicon was etched by the gas etching apparatus of FIG. 7. Measurement was made of the etching rate of the polycrystalline silicon relative to the above-defined conductance of the etching gas-conducting pipe. $C_T$ was varied by changing the diameters of the small ports 42 and controlling the valves 45. $P_T$ was measured by the pressure gauge 12; $Q_A$ by the mass flow meter 14; Pe by a pressure gauge 48; and Qe by a mass flow meter 50. The gas introduced into the gas etching apparatus for determination of the conductance $C_T$ was $N_2$. The other conditions involved in the above-mentioned experiment were as follows:

Temperature: 300° K.
Pressure range (in etching chamber): 0.1 to 1.5 Torr
Length of etching gas-conducting pipe: 1 meter
Se: 500 l/min, 2,000 l/min
Material being etched: Polycrystalline silicon wafer
Etching gas composition: Carbon tetrafluoride gas having a partial pressure of 0.4 Torr and oxygen gas having a partial pressure of 0.2 Torr
Microwave power: 680W The results of the experiment are set forth in the graph of FIG. 8. The curves j, k denote data obtained when Se was set at 500 l/min and 2,000 l/min. Se was varied by means of different vacuum pumps. It was found from the two curves j, k that an etching rate of 100 Å/min could be obtained with the following formula was satisfied.

$$10^{-1} Se \leq C_T \leq 5 \times 10^2 Se$$

This formula is applicable to any type of etching gas-conducting pipe. Particularly where the etching gas-conducting pipe is formed of a single round pipe, the inner diameter of said conducting pipe should fall within the range of 1.5 to 9cm to satisfy the above formula.

As apparent from the foregoing description, the gas etching apparatus of this invention can efficiently etch, for example, polycrystalline silicon wafer.

What we claim is:
1. A gas etching apparatus comprising an etching gas-producing chamber; means for introducing into said chamber a mixture of a gas containing fluorine atoms and a gas containing oxygen atoms; means for activating the gas mixture received in the etching gas-producing chamber; an etching chamber provided in a region located apart from the etching gas-producing chamber and free from an electric field produced by the activating means; means for exhausting the etching gas from the etching chamber; and an etching gas-conducting means providing communication between the etching gas-producing chamber and the etching chamber and having conductance conforming to the formula:

$$10^{-1} Se \leq C_T \leq 5 \times 10^2 Se$$

where:
$C_T$ = conductance (l/min) of the etching gas-conducting means;
$Se$ = effective exhaust speed (l/min) in the etching chamber.

2. The gas etching apparatus according to claim 1, wherein the means for activating the gas mixture is high frequency discharging means.

3. The gas etching apparatus according to claim 2, wherein the high frequency discharging means is microwave discharging means.

4. The gas etching apparatus according to claim 1, wherein the etching gas-producing chamber is built of quartz; and the etching gas-conducting means and etching chamber are made of a metal plate coated with a layer of polytetrafluoroethylene.

5. The gas etching apparatus according to claim 1, wherein the etching gas-conducting means is formed of a pipe.

6. The gas etching apparatus according to claim 1, wherein the etching gas-conducting means is formed of a plurality of separate pipes.

7. The gas etching apparatus according to claim 1, wherein the etching gas-conducting means is formed of a plurality of branch pipes.

8. The gas etching apparatus according to claim 1, wherein the etching gas-conducting means is formed of a single round pipe having an inner diameter ranging between 1.5cm and 9cm.

9. The gas etching apparatus according to claim 1, wherein the means for activating the gas mixture is microwave discharging means comprising a microwave source, an isolator provided with a dummy load, a power monitor, a three-stub tuner, and an applicator fitted with a short plunger; the etching gas-producing chamber penetrates the applicator crosswise; the etching gas-conducting means is inserted into the etching chamber with its intermediate portion divided into a plurality of branches whose downstream ends are jointly connected to a single common distributing pipe bored with a plurality of small ports; and the means for exhausting comprises a manifold type outlet pipe.

10. A gas etching process which comprises the steps of introducing a mixture of a gas containing fluorine atoms and a gas containing oxygen atoms into an etching gas-producing chamber; activating the gas mixture; introducing the activated gas mixture through an etching gas-conducting means into an etching chamber provided in a region located apart from the etching gas-producing chamber and free from an electric field produced by activating the gas mixture; exhausting the gas mixture from the etching chamber; and etching a nongaseous material received in the etching chamber by the activated gas mixture, wherein the activated gas mixture is conducted into the etching chamber to satisfy the formula:

$$10^{-1} Se \leq C_T \leq 5 \times 10^2 Se$$

where:
- $C_T$ = conductance (l/min) of the etching gas-conducting means;
- $Se$ = effective exhaust speed (l/min) in the etching chamber.

11. The gas etching process according to claim 10, wherein the gas containing fluorine atoms is carbon tetrafluoride gas, and the gas containing oxygen atoms is oxygen gas.

12. The gas etching process according to claim 10, wherein the step of activating the gas mixture is the step of applying microwave power to said gas mixture.

* * * * *